(12) United States Patent
McConnell et al.

(10) Patent No.: US 6,279,129 B1
(45) Date of Patent: Aug. 21, 2001

(54) CONFIGURATION OF MEMORY CELLS AND METHOD OF CHECKING THE OPERATION OF MEMORY CELLS

(75) Inventors: Roderick McConnell; Detlev Richter, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/465,726

(22) Filed: Dec. 17, 1999

Related U.S. Application Data

(63) Continuation of application No. PCT/DE98/01457, filed on May 27, 1998.

(51) Int. Cl.⁷ .................................................. G11C 29/00
(52) U.S. Cl. .......................................................... 714/718
(58) Field of Search ..................... 714/718, 719, 714/6

(56) References Cited

U.S. PATENT DOCUMENTS

| | | |
|---|---|---|
| 4,654,847 | 3/1997 | Dutton . |
| 5,073,891 | 12/1991 | Patel . |
| 5,563,833 * | 10/1996 | Adams et al. ............. 365/201 |
| 5,617,531 | 4/1997 | Crouch et al. . |
| 5,644,578 | 7/1997 | Ohsawa . |
| 5,818,848 * | 10/1998 | Lin et al. ............. 714/718 |

FOREIGN PATENT DOCUMENTS

| | | |
|---|---|---|
| 3728521A1 | 3/1989 | (DE) . |
| 4034167A1 | 5/1991 | (DE) . |
| 0378538B1 | 1/1992 | (EP) . |

* cited by examiner

*Primary Examiner*—Phung M. Chung
(74) *Attorney, Agent, or Firm*—Herbert L. Lerner; Laurence A. Greenberg; Werner H. Stemer

(57) ABSTRACT

A method of checking the operation of memory cells. A first group of memory cells and a second group of memory cells are provided. The first group of memory cells is tested and a first set of test results is obtained, and the first set of test results is stored in the second group of memory cells. The first set of test results is read from the second group of memory cells. The second group of memory cells is tested and a second set of test results is obtained. The second set of test results is stored in the first group of memory cells. The test results can be compressed before they are output. Errors can be corrected by using an error correction code or duplicate copies of the test results. The method allows a test device to be provided that does not have memory. The complexity of the test device is therefore advantageously reduced. An electronic circuit is provided that includes a first group of memory cells, a second group of memory cells, and a test device programmed such that the method can be performed.

4 Claims, 4 Drawing Sheets

FIG.4
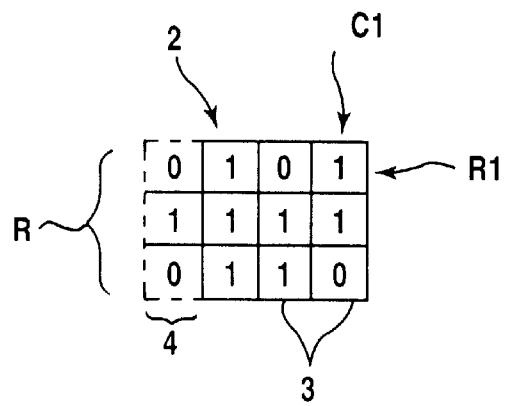
FIG.5
RADR = 001 ∧ CADR = 010
FIG.6
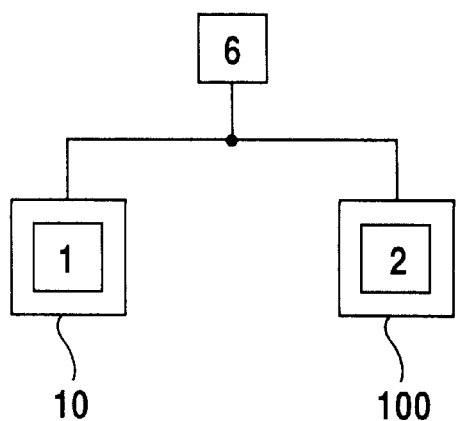

CONFIGURATION OF MEMORY CELLS AND METHOD OF CHECKING THE OPERATION OF MEMORY CELLS

CROSS-REFERENCE TO RELATED APPLICATION

This is a continuation of copending International Application PCT/DE98/01457, filed May 27, 1998, which designated the United States.

BACKGROUND OF THE INVENTION

Field of the Invention

The invention relates, in general, to a configuration of memory cells and to a method of checking the operation of memory cells.

Integrated memories have memory cells that can store data. This is usually digital data, in other words, the logic states "0" and "1". After a memory has been manufactured, it is necessary to check the operation of the memory and hence of the individual memory cells. It is customary practice to write test data to each individual memory cell and to read out this test data. To determine whether there is an operational fault, the test data that has been written in is compared with the test data that has been read out.

The following description illustrates how a simple operational check may be performed. First, data in the form of zeros are written to all of the memory cells in the integrated memory and are then read out. By comparing the data read out from each memory cell with the written data item "zero", operational errors can be detected. Subsequently, a logic one is similarly written to all of the memory cells and is read out. The comparison described above takes place again for each memory cell, but now using the data item "one". If an error is detected by at least one of the comparisons for a particular memory cell, it is regarded as faulty.

In addition to the simple case outlined, in which all logic zeros and all logic ones are respectively successively written to the memory cells and are read out again, more complicated test patterns can also be written to the memory.

To increase the yield in memory production, it is known to provide redundant rows and redundant columns of memory cells that can be used, dependent upon test results, to replace rows and columns having faulty memory cells. They are activated by an appropriate programming technique, for example using laser fuses, such that when the appropriate row or column address is applied, one of the redundant rows or columns is addressed instead of the row or column having the faulty memory cell or cells.

The operational check described above requires the transmission of large quantities of data. This includes the transmission of the data read out of the memory cells to an appropriate test facility performing the check and includes the data obtained from comparing the original test data with the data that has been read out. One factor limiting the potential data rate is the number of available connections in the memory. In particular, if the memory is a memory core situated as a so-called "embedded memory" together with other circuit components, such as a processor, on a common integrated circuit, this common integrated circuit has a small number of external connections that can be used to directly access the memory from outside of the integrated circuit. In extreme cases the common integrated circuit may not have any external connections that can be used to directly access the memory.

To get around the problem caused by the bottleneck of having only a few available connections, it is known practice, in embedded memories, to provide a test circuit with the memory on the integrated circuit. This test circuit can be a hardwired logic unit or a controller that independently carries out the desired operational check (i.e., writing the original test data to the memory cells, reading the data from the memory cells and comparing the data read out with the original test data) and supplies an appropriate result signal external to the integrated circuit if operational errors occur. However, the addresses of the faulty memory cells cannot be determined from outside of the integrated circuit. Such a setup is also called a "built-in self-test" (BIST).

To perform the operational check described, the test circuit generally has an appropriate memory that can store the test results.

U.S. Pat. No. 5,073,891 teaches a method and an apparatus for checking the operation of memory cells, in which the memory is divided into two groups (partitions) that are successively checked. While one group is being checked the other group is being used for other purposes.

U.S. Pat. No. 4,654,847 teaches an apparatus for automatically correcting erroneous data. Data errors are detected in a main memory. If these are single-bit errors, when the errors are read out, they are eliminated by an error correction unit. If multiple-bit errors occur, the address, the position, and the correct value of the respective data item are stored in an additional memory, that is smaller than the main memory.

SUMMARY OF THE INVENTION

It is accordingly an object of the invention to provide a method of checking the operation of memory cells and an electronic circuit for performing the method.

With the foregoing and other objects in view there is provided, in accordance with the invention, a method of checking the operation of memory cells. A first group of memory cells and a second group of memory cells are provided. The first group of memory cells is tested and a first set of test results is obtained, and the first set of test results is stored in the second group of memory cells. The first set of test results is read from the second group of memory cells. The second group of memory cells is tested and a second set of test results is obtained. The second set of test results is stored in the first group of memory cells. The method allows a test device to be provided that does not have memory. The complexity of the test device is therefore advantageously reduced.

In accordance with another feature of the invention, the memory cells of the two groups are component parts of a common memory or memory configuration, and temporary storage takes place in the memory cells of the second group before the test results are output from the memory. Since the memory cells of the first group are tested before test results are output to a device external to the common memory, the time when the test results are output is advantageously independent of the time during which they are produced. This means that the operational check can be performed more quickly, because it is performed independently of the delay that occurs due to the bottleneck of test results that are transmitted through external connections to a device that is not a part of the common memory.

A further advantage is that storing the test results in the memory configuration allows the temporarily stored test results to be evaluated before they are read out to outside of the memory. This allows the test results to be compressed by, for example, only outputting the addresses of faulty memory cells to outside of the memory configuration.

In accordance with an added feature of the invention, the stored test results are used to perform a redundancy analysis on the tested memory cells. Only the results of the redundancy analysis, namely the addresses of memory cell rows and columns that are to be replaced by redundant rows and redundant columns of memory cells are transmitted to outside of the memory configuration. This provides an advantage that the onchip redundancy analysis also compresses the test results, which are then output to outside of the memory configuration, not in their entirety, but merely in the reduced form of the result of the redundancy analysis. The quantity of data to be transmitted is thus significantly reduced. The result of the redundancy analysis transmitted to outside of the memory configuration can be used directly for appropriately programming the redundant rows and/or columns of the memory configuration using an appropriate external programming circuit. For example, a laser can be used to melt separable connections.

In accordance with an additional feature of the invention, the stored test results are read out of the memory cells of the second group and the memory cells of the second group are then tested. The test results from the memory cells of the second group are then temporarily stored in the memory cells of the first group. This allows all of the memory cells in the memory configuration to be checked in two successive phases. It is naturally also possible to divide the memory configuration into more than two groups of memory cells, which are alternately tested.

In accordance with a further feature of the invention, the test results are stored in the memory cells of the first and of the second group using an error correction code. This allows errors occurring when the test results are stored to be corrected when the test results from the memory cells are read out and evaluated (for example during the redundancy analysis described). Such errors can be attributed to, for example, the fact that the memory cells of the second group have not undergone any operational check when the test results for the memory cells of the first group are temporarily stored in the memory cells of the second group.

In accordance with yet another feature of the invention, alternatively or in addition to using error correction codes for storing the test results, the entire set of test results from the first or the second group of memory cells can be stored in each of at least two subgroups of memory cells of the other group of memory cells. The copies of the test results are compared with each other when the test results are read out. In this manner, it is also possible to establish whether errors have occurred during storage of the test results. If more than two copies of each test result are stored, error correction is also possible by regarding the value occurring most frequently within the copies of a test result when the memory cells are read as the "correct" test result.

In accordance with yet an added feature of the invention, the addresses of faulty memory cells are stored as test results. This allows the quantity of data that is stored as test results to be reduced, because, generally, only a very small proportion of all of the memory cells is faulty. In contrast, when a so-called "bit map" is produced, test data for each tested memory cell must be stored, where each memory cell is assigned to a corresponding result bit that contains the test result "operable" or "faulty" in the form of binary information.

With the objects of the invention in view, there is also provided an electronic circuit that includes a first group of memory cells, a second group of memory cells, and a test device. The test device is programmed to test the first group of memory cells and obtain a first set of test results; store the first set of test results in the second group of memory cells; read the first set of test results from the second group of memory cells and output the read first set of test results to a device that is disposed external from the electronic circuit; test the second group of memory cells and obtain a second set of test results; and store the second set of test results in the first group of memory cells.

In accordance with yet another feature of the invention, the first and the second groups of memory cells can be component parts of different memories. These memories can be configured on different integrated circuits. The two memories are then tested alternately, with one of the two memories temporarily storing the test results for the other one. The invention can also be used for checking the operation of groups of memory cells configured on a wafer.

Other features which are considered as characteristic for the invention are set forth in the appended claims.

Although the invention is illustrated and described herein as embodied in arrangement having memory cells and method of checking the operation of memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 shows test results from a first group of memory cells and parity bits that have been entered into a second group of memory cells;

FIG. 5 shows data compression achieved by storing the addresses of faulty memory cells in the second group of memory cells;

FIG. 6 shows another illustrative embodiment of the invention in which two different memories are tested.

DESCRIPTION OF THE PREFERRED EMBODIMENTS

Figure 1:
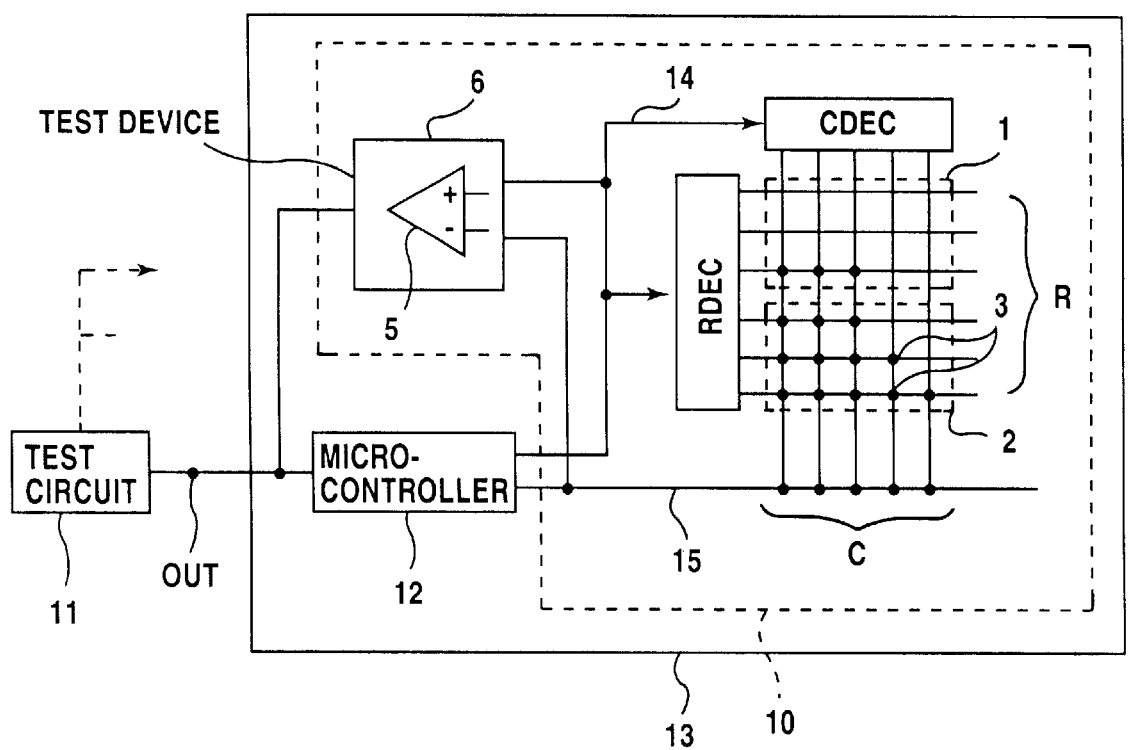
FIG. 1 shows an integrated circuit having a memory with a first embodiment of a plurality of memory cells.

Referring now to the figures of the drawing in detail and first, particularly, to FIG. 1, thereof, there is shown an integrated circuit 13 having a memory 10 with a first embodiment of a plurality of memory cells 3 (memory matrix) and a test device 6 for checking the operability of the memory cells 3. The memory cells 3 are configured in matrix form in rows R and columns C. The rows R can be addressed using a row decoder RDEC and the columns C can be addressed using a column decoder CDEC. The memory cells 3 are DRAM memory cells that are usually one-transistor/ one-capacitor memory cells. Other types of memory cells are also feasible.

One half of the memory cells 3 are combined into a first group 1, and the other half of the memory cells 3 are combined into a second group 2.

The figures only show components that are essential for the operation of the invention. Accordingly, only a small number of memory cells 3 are shown.

The integrated circuit 13 also has a microcontroller 12 that is connected to the decoders RDEC, CDEC through an address bus 14. Memory cells 3 that are addressed by the microcontroller 12 through the address bus 14 can be written to by the microcontroller 12 or can be read by the microcontroller through a data bus 15. The memory 10 is an embedded memory that can be accessed exclusively by the microcontroller 12, but not directly from outside of the integrated circuit 13. The microcontroller 12 is connected to the external connections OUT of the integrated circuit 13, which it uses to communicate with components that are external to the integrated circuit 13.

The test device 6 is also connected to the address bus 14 and to the data bus 15, so that it can address the memory cells 3 through the address bus 14 and can write data to them and read data out from them through the data bus 15. To check the operation of the memory cells 3, the test device 6 writes test data (for example plain ones or plain zeros) to all of the memory cells 3 in the first group 1. The test device 6 then reads the memory cells 3 in the first group 1 in succession and compares the data read out with the previously written test data item. FIG. 1 indicates that this comparison between the data that has been read out and the data that was previously written in is performed using a comparator 5. The result of this comparison, specifically, the output signal obtained from the comparator 5, is stored for each memory cell 3 of the first group 1 in a respective memory cell 3 of the second group 2. In this illustrative embodiment the number of memory cells 3 in the second group 2 equals the number of memory cells 3 in the first group 1.

After the memory cells 3 in the first group 1 have been checked, the test results that have been stored in the memory cells 3 in the second group 2 are read out by the test device 6 and are made available to components that are external to the integrated circuit 13 through the external connections OUT. Outside of the integrated circuit 13, the test results are evaluated further by a test circuit 11 to determine whether or not the memory 10 has passed the operational check.

Figure 2:
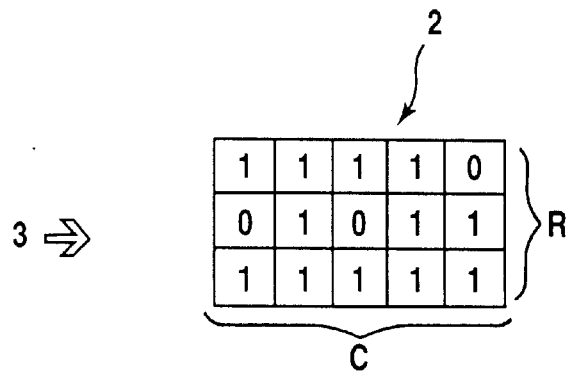
FIG. 2 shows test results from a first group of memory cells that have been entered into a second group of memory cells.

FIG. 2 shows test results from the first group 1 of memory cells 3 that have been entered into the memory cells 3 of the second group 2 by the test device 6. In this case, a one indicates that the value read out and the value that was previously written in are in agreement. A stored zero indicates that the value read out and the value that was previously written in are different, therefore, the corresponding memory cell 3 in the first group 1 is faulty. Since each memory cell 3 in the first group 1 has been assigned a memory cell 3 in the second group 2 (in FIG. 4, these are the ones with solid lines), a bit-fail map has been produced which shows the positions of the faulty and intact memory cells 3 of the first group 1.

With this illustrative embodiment of the method of the invention, only the addresses of the faulty memory cells 3 from the first group 1 are transmitted outside the integrated circuit 13 to the test circuit 11. This allows a significant reduction in the quantity of data to be transmitted.

FIG. 5 shows another illustrative embodiment of the method of the invention, in which rather than storing a bit-fail map within the second group 2, as shown in FIG. 2, only the addresses of the individual faulty memory cells of the first group 1 are stored in the second group 2. The addresses are divided into column addresses CADR and row addresses RADR. Since, generally, much fewer memory cells are faulty than are intact, it is therefore possible to compress the test results that are stored. This enables the number of memory cells 3 in the second group 2 to be chosen very much smaller than the number of memory cells 3 in the first group 1. The quantity of data transmitted to the test circuit 11 when outputting the test results are reduced in this case as well.

Figure 3:
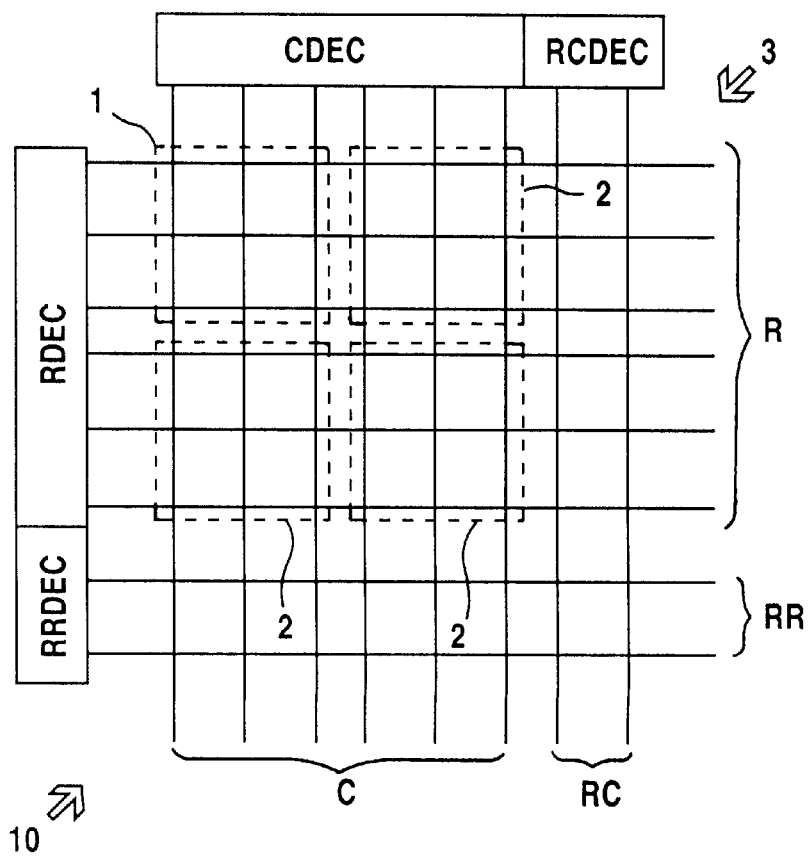
FIG. 3 shows a second embodiment of the plurality of memory cells shown in FIG. 1.

FIG. 3 shows a second illustrative embodiment of the memory matrix of the memory 10, which has memory cells 3 configured in rows R and columns C as shown in FIG. 1, however, the second illustrative embodiment additionally has redundant memory cells configured in rows RR and columns RC. Each one of the redundant rows RR or columns RC can be used, in a redundancy situation, for address-based replacement of one of the rows R or columns C of the memory cells 3. The test device 6 now performs an operational check on the memory cells 3 of the first group 1 and stores the test results, as explained previously with reference to FIG. 1, in the memory cells 3 of the second group 2. In this second illustrative embodiment, the test device 6 additionally performs a redundancy analysis on the test results stored in the memory cells 3 of the second group 2. A redundancy analysis identifies whether one or more of the rows R or columns C of memory cells 3 includes at least one defective memory cell 3. In this manner it is determined whether one or more of the rows R or columns C of memory cells 3 should be replaced by one of the redundant columns RC or rows RR of memory cells 3. In FIG. 4, for example, arrows have been used to indicate a respective row R1 and a respective column C1 of the second group 2. The associated row and column of the first group 1 needs to be replaced by a redundant column RC and row RR because of the faults identified by the zeros stored in the second group 2 of memory cells 3. A person skilled in the art of conventional redundancy analysis circuits, which are usually used in memory testers for DRAMs, is aware of algorithms for carrying out the described redundancy analysis.

The test circuit 11 shown in FIG. 1 receives the results of the redundancy analysis and performs appropriate programming (indicated by the dashed arrow) of fuse elements (not shown) in redundancy decoders RRDEC, RCDEC (FIG. 3) for addressing the redundant lines RR, RC and in the normal decoders RDEC, CDEC.

FIG. 4 shows the second group 2 of memory cells 3 with stored test results for the first group 1 of memory cells. Arrows mark the test result of a respective row R1 and column C1 that needs to be replaced because a faulty memory cell 3 is indicated (identified by the temporarily stored zero).

FIG. 4 also shows another feature of a further illustrative embodiment of the second group 2 of memory cells 3, in which some of the memory cells 3 (shown dashed in FIG. 4) are used for storing parity bits 4. For the sake of simplicity, only one parity bit is shown per row R. The parity bits 4 are stored in the second group 2 by the test device 6 while the test results are being stored in the other memory cells 3 of the second group 2. The parity bits 4 are produced using an error correction code, such as the Reed-Solomon code. The use of such an error correction code allows test results that have possibly been corrupted during temporary storage to be recognized and possibly corrected when the test results are subsequently read out by the test device 6.

The illustrative embodiment in FIG. 3 also differs from that shown in FIG. 1 in that the memory 10 has three second groups 2 of memory cells 3. Each one of the second groups 2 has the same number of memory cells 3 as the first group 1. The test device 6 stores each test result in each of the second groups 2, so that all of the test results are stored in triplicate. When the test results are output or when the test results are evaluated in the course of a redundancy analysis, the test device 6 compares all three copies of each one of the test results, so that it recognizes errors occurring when the test results are stored. The test device 6 carries out further processing on the test result value which occurs most frequently within the copies of the respective test result, treating it as the correct test result.

FIG. 6 shows an illustrative embodiment of the invention in which the first group 1 of memory cells 3 and the second group 2 of memory cells 3 are configured in different memories 10 and 100. It is also possible to use the invention in this case, so that the test device 6 carrying out the test requires no additional memory for storing the test results.

The test device 6 can be a microcontroller processing an appropriate test program to carry out the operational check described or it can be a hard-wired logic unit. A person skilled in the art of implementing built-in self-tests should now be enabled to use either of these two well-known variants to carry out an operational check of a memory according to the present invention.

Figure 7:
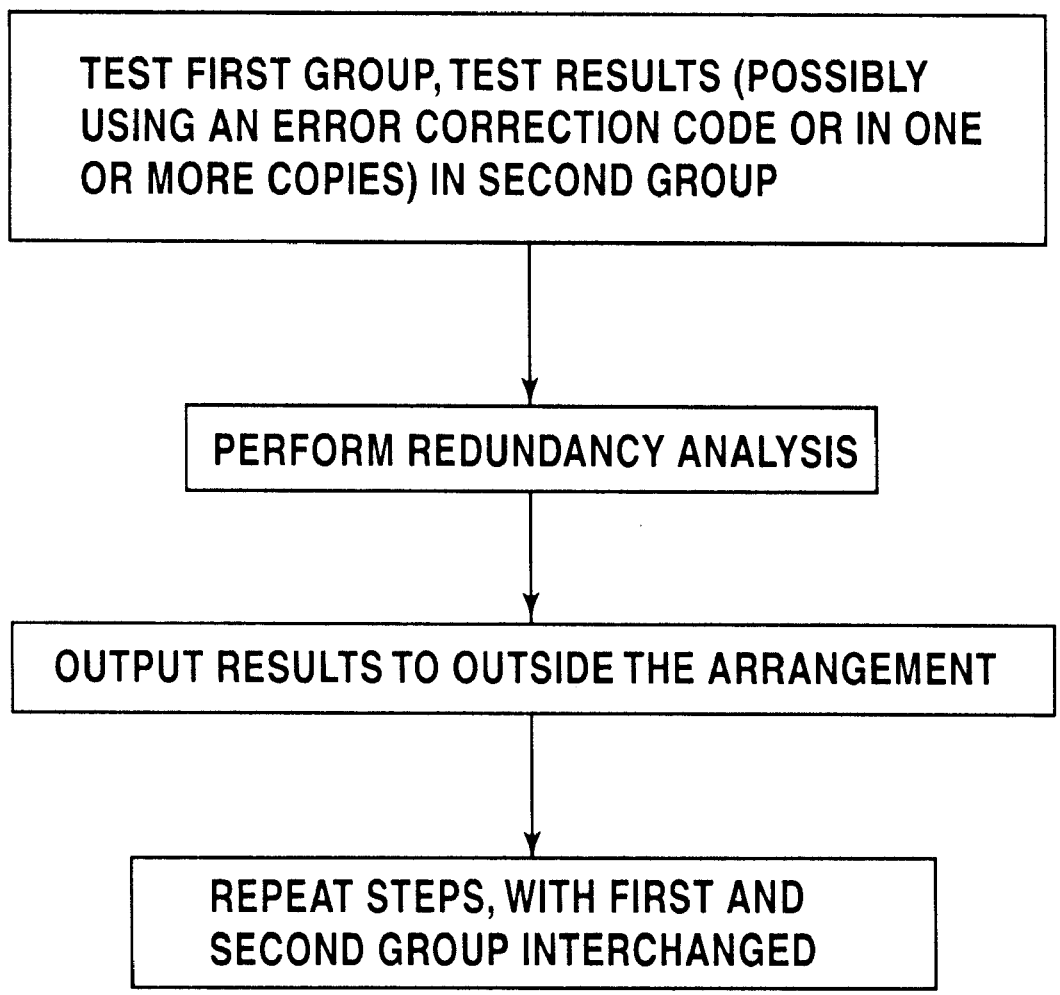
FIG. 7 shows a flow chart illustrating the test method according to the invention.

FIG. 7 shows a flow chart illustrating the method of checking the operation of memory cells as has been described hereinabove with reference to the other figures.

We claim:

1. A method of checking the operation of memory cells, which comprises:

providing a first group of memory cells and a second group of memory cells;

testing the first group of memory cells and obtaining a first set of test results;

storing the first set of test results in the second group of memory cells;

reading the first set of test results from the second group of memory cells;

testing the second group of memory cells and obtaining a second set of test results;

storing the second set of test results in the first group of memory cells;

defining a chosen set of test results selected from the first set of test results and the second set of test results;

storing a duplicate set of the chosen set of test results; and comparing the duplicate set of test results with the chosen set of test results.

2. The method according to claim 1, wherein at least one of the storing steps is performed using an error correction code.

3. An electronic circuit comprising:

a first group of memory cells and a second group of memory cells; and a test device programmed to:

test the first group of memory cells and obtain a first set of test results;

store the first set of test results in the second group of memory cells;

read the first set of test results from the second group of memory cells and output the read first set of test results to a device that is disposed external from the electronic circuit;

test the second group of memory cells and obtain a second set of test results;

store the second set of test results in the first group of memory cells;

define a chosen set of test results selected from the first set of test results and the second set of test results;

store a duplicate set of the chosen set of test results; and compare the duplicate set of test results with the chosen set of test results.

4. The electronic circuit according to claim 3, wherein said test device is programmed to store at least one of the first group of memory cells and the second set of memory cells using an error correction code.

* * * * *